US006831840B2

(12) United States Patent
Ruff

(10) Patent No.: US 6,831,840 B2
(45) Date of Patent: Dec. 14, 2004

(54) PRINTED CIRCUIT BOARD ASSEMBLY AND METHOD THEREFOR

(75) Inventor: Charles C. Ruff, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/424,951

(22) Filed: Apr. 28, 2003

(65) Prior Publication Data

US 2003/0206404 A1 Nov. 6, 2003

Related U.S. Application Data

(63) Continuation of application No. 10/132,527, filed on Apr. 25, 2002, now Pat. No. 6,556,452, which is a continuation of application No. 09/838,719, filed on Apr. 19, 2001, now Pat. No. 6,396,705, which is a continuation of application No. 09/185,496, filed on Nov. 4, 1998, now Pat. No. 6,239,979.

(51) Int. Cl.[7] .............................. H05K 5/00; H05K 5/04; H05K 5/06; H05K 7/14; H05K 7/18

(52) U.S. Cl. ....................... 361/759; 361/801; 361/802; 439/327

(58) Field of Search .................................. 361/683–686, 361/736, 740, 741, 747, 748, 756–757, 759, 772, 776, 801–803, 807, 796, 728, 809; 211/41.17; 439/327; 248/559; 174/260, 267, 130

(56) References Cited

U.S. PATENT DOCUMENTS

| 4,198,024 | A | | 4/1980 | Cavanna ..................... 248/544 |
|---|---|---|---|---|
| 4,477,135 | A | * | 10/1984 | Pronto .......................... 439/62 |
| 4,745,524 | A | | 5/1988 | Patton, III ................... 361/399 |
| 4,917,624 | A | | 4/1990 | Yu ............................. 439/328 |
| 4,987,517 | A | | 1/1991 | Kurz ........................... 361/417 |
| 5,319,524 | A | | 6/1994 | Welch et al. ................ 361/754 |
| 5,440,362 | A | | 8/1995 | Jones .......................... 361/451 |
| 5,914,854 | A | * | 6/1999 | Holt ............................ 361/683 |
| 5,986,892 | A | | 11/1999 | Hargy, III ................... 361/759 |
| 6,045,386 | A | | 4/2000 | Boe ............................ 439/327 |
| 6,137,689 | A | * | 10/2000 | Schechtel et al. ........... 361/759 |
| 6,158,594 | A | * | 12/2000 | Boe ........................... 211/41.17 |
| 6,239,979 | B1 | * | 5/2001 | Ruff ........................... 361/759 |
| 6,396,705 | B2 | * | 5/2002 | Ruff ........................... 361/759 |
| 6,556,452 | B2 | * | 4/2003 | Ruff ........................... 361/759 |

* cited by examiner

Primary Examiner—Phuong T. Vu
(74) Attorney, Agent, or Firm—Schwegman, Lundberg, Woessner & Kluth, P.A.

(57) ABSTRACT

A bracket assembly includes a bracket which readily and easily couples with a printed circuit board. The bracket includes at least one tab assembly foldably attached with a support flange for supporting the printed circuit board. The bracket also includes an outer flange which is coupled with the computer chassis. Alignment apertures on the support flange and the printed circuit board facilitate the alignment of the printed circuit board, and allow for rework of the printed circuit board. Each tab assembly is adapted to frictionally engage with corresponding features on the printed circuit board.

12 Claims, 4 Drawing Sheets

PRINTED CIRCUIT BOARD ASSEMBLY AND METHOD THEREFOR

This application is a continuation of U.S. patent application Ser. No. 10/132,527, filed on Apr. 25, 2002, now issued as U.S. Pat. No. 6,556,452, which is a continuation of U.S. patent application Ser. No. 09/838,719, filed on Apr. 19, 2001, now issued as U.S. Pat. No. 6,396,705, which is a continuation of U.S. patent application Ser. No. 09/185,496, filed on Nov. 4, 1998, now issued as U.S. Pat. No. 6,239,979, all of which are herein incorporated by reference.

FIELD OF THE INVENTION

The present invention relates generally to brackets. More particularly, it pertains to brackets for the interface of printed circuit boards.

BACKGROUND OF THE INVENTION

For personal computers, an external interface between the internal printed circuit board and the user is required, examples of which include enhanced video adapter cards and network adapter cards. The interface bracket assists in securing the printed circuit board to the computer housing, and is coupled with the printed circuit board prior to shipment to a customer. It is desirable to position and assemble components, such as the interface bracket and the printed circuit board, within the computer chassis such that they are easily removable by and easily disassembled/reassembled by a user or technician, for example, for repair or replacement. In addition, the interface bracket assists in providing mechanical integrity between the add-in card and the mother board. The interface bracket further aids in creating an electrical seal between the computer chassis and the add-in card, as required by industry standards for EMI (Electromagnetic Interference), RFI (Radio Frequency Interference), and ESD (Electrostatic Discharge). Industry standards such as ISA (Industry Standard Architecture), PCI (Peripheral Component Interconnect), and EISA (Extended Industry Standard Architecture) further require certain geometries between the add-in cards and the bracket.

Typically, the printed circuit board is secured to the interface bracket using threaded fasteners or rivets that are inserted through the printed circuit board and into the bracket. This method has several drawbacks, such as, when the printed circuit board is removed, the screws are occasionally misplaced or the rivets and the bracket are permanently deformed. In addition, if all of the screws are not used to attach the printed circuit board to the bracket, the printed circuit board may not be secure, resulting in vibration of the printed circuit board, potentially causing damage to the components thereon. Other disadvantages of these methods include assembly labor cost, piece part cost, inconsistencies in the relationship of the bracket to the printed circuit board, potential variance in the electrical continuity between the bracket and the printed circuit board, and mechanical reliability of the components.

Accordingly, what is needed is a bracket which overcomes these disadvantages and ensures consistent mechanical geometry between the bracket and the printed circuit board. What is further needed is a bracket which is easy to remove and install, and minimizes the costs of procurement and assembly.

SUMMARY OF THE INVENTION

A bracket is adapted for assembling a printed circuit board thereto and is adapted for retaining the printed circuit board. The bracket securely retains the printed circuit board without the need of additional fasteners or other hardware. In one embodiment, the bracket includes an assembly tab, which has a shoulder portion and a flexible portion, where the flexible portion extends to a rounded distal tip. The shoulder portion protects the edge of the circuit board as the flexible portion is formed over the printed circuit board. The distal tip of the assembly tab is adapted for coupling with coupling features of a printed circuit board. The bracket further includes a support flange adapted to couple with a printed circuit board, and an outer flange which is adjacent to the support bracket. The bracket also includes coupling features, such as a first and/or a second set of apertures disposed on the support flange.

In another embodiment, a bracket assembly is provided which securely retains a printed circuit board to a bracket without the need of additional fasteners or hardware. The bracket assembly includes a bracket and a printed circuit board. The bracket includes an assembly tab, which has a shoulder portion and a flexible portion, where the flexible portion extends to a distal tip. The shoulder portion protects the edge of the circuit board as the flexible portion is formed over the printed circuit board. The distal tip of the assembly tab is adapted for coupling with coupling features of a printed circuit board. The bracket further includes a support bracket adapted to couple with a printed circuit board, and an outer bracket which is adjacent to the support bracket.

In yet another embodiment, a bracket assembly and system is provided for use in a computer system, which includes a printed circuit board coupled therewith. The bracket assembly is adapted to allow for easy assembly of the printed circuit board therewith. A computer chassis encompasses a bracket assembly, which includes a bracket and a printed circuit board. The bracket includes an assembly tab, which has a shoulder portion and a flexible portion, where the flexible portion extends to a distal tip. The shoulder portion protects the edge of the circuit board as the flexible portion is formed over the printed circuit board. The distal tip of the assembly tab is adapted for coupling with coupling features of a printed circuit board. The bracket further includes a support bracket which adapted to couple with a printed circuit board, and an outer bracket which is adjacent to the support bracket.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
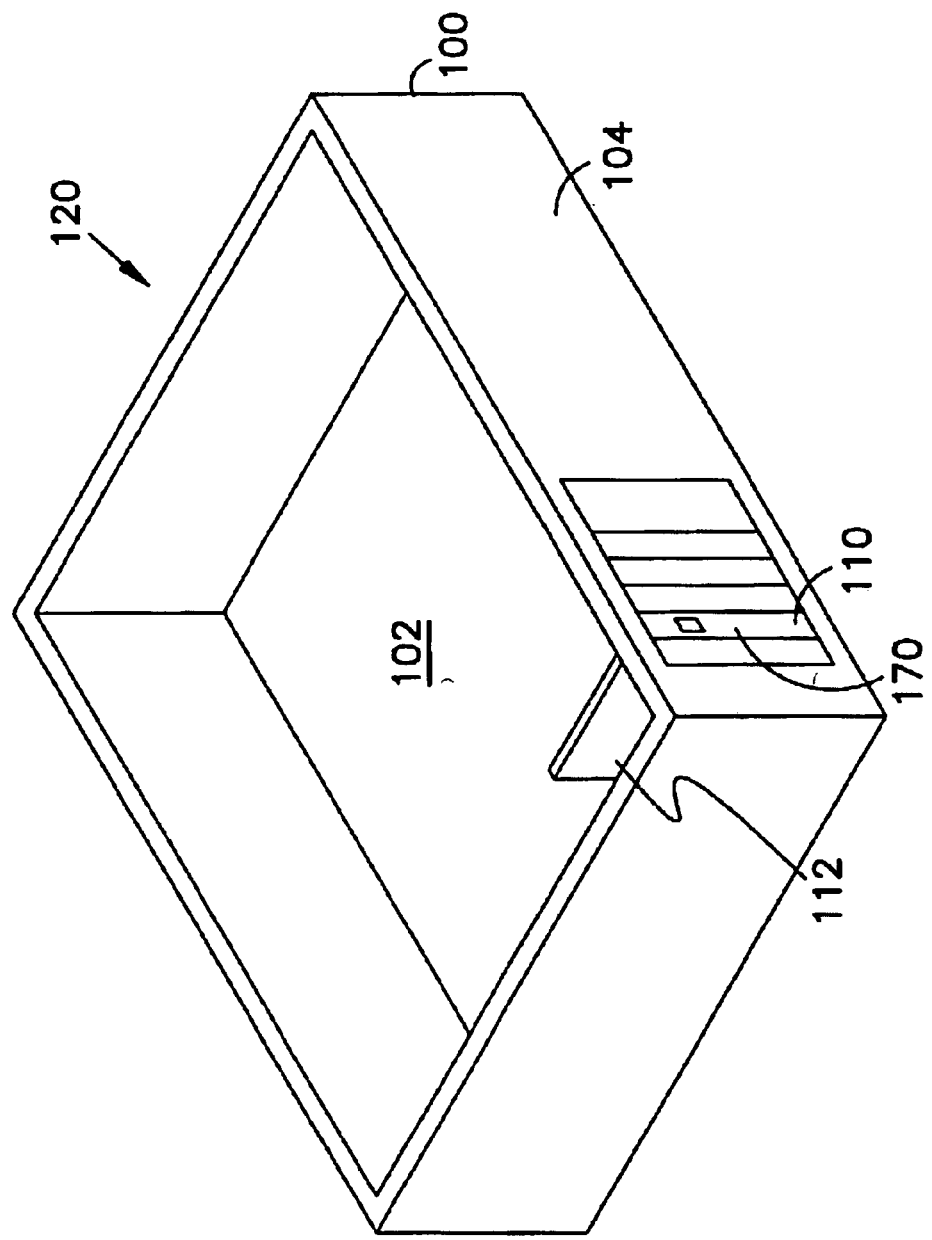
FIG. 1 is a perspective view illustrating a computer chassis and bracket assembly constructed in accordance with one embodiment of the present invention.

A bracket assembly 110 is provided for use in a computer system 120, as shown in FIG. 1, which includes a printed circuit board 112 coupled therewith. The bracket assembly 110 is adapted to allow for easy assembly of the printed circuit board 112 to the bracket assembly 110. Enclosing and protecting the computer system is a computer chassis 100. The computer chassis 100, although not limited to, is a structure which protects the computer system which includes a housing base 102, housing walls 104, and a housing cover (not shown). One of the housing walls, 104, as shown in FIG. 1, is adapted to couple with the bracket assembly 110. It should be noted that multiple bracket assemblies can be provided.

Figure 2:
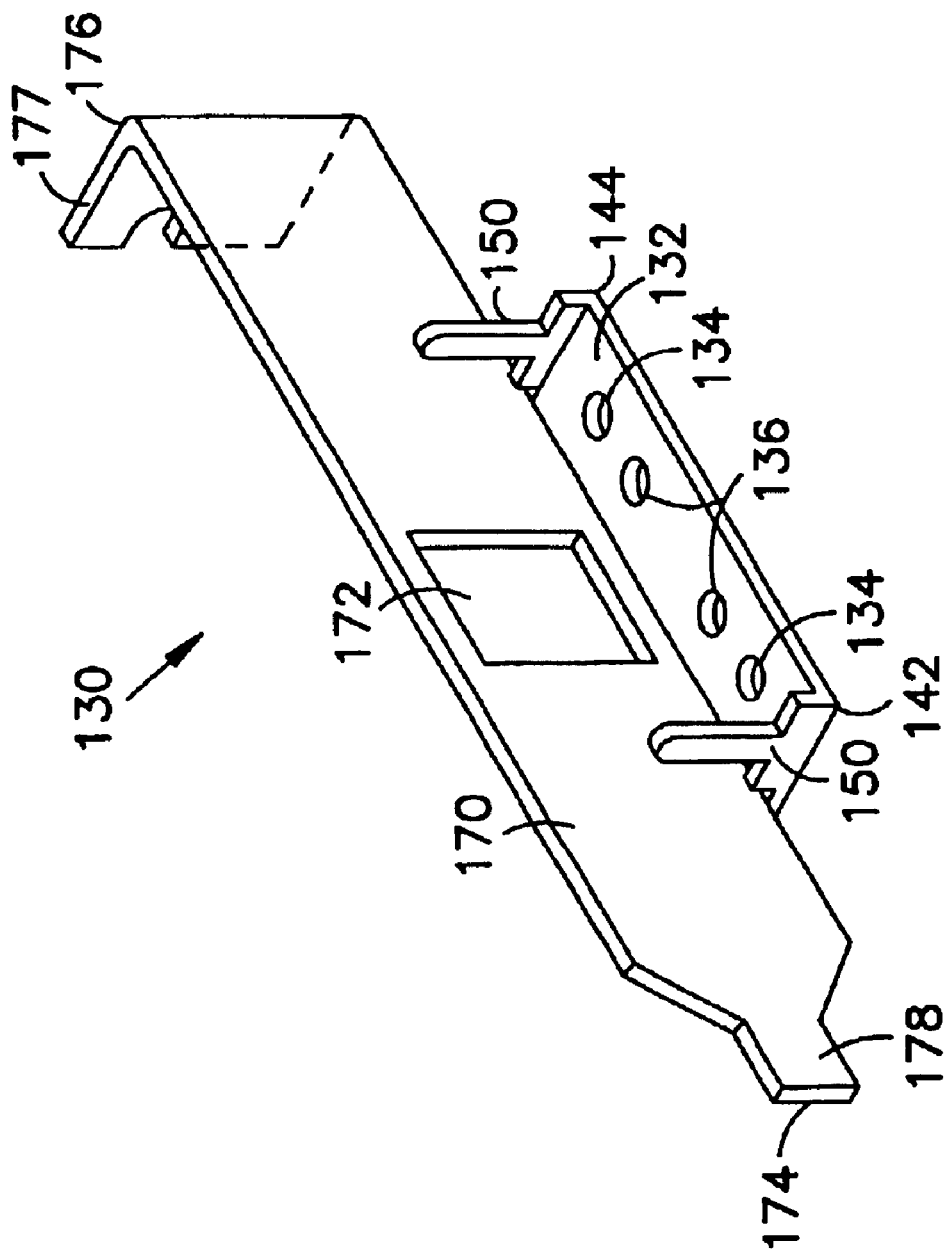
FIG. 2 is a perspective view illustrating a bracket constructed in accordance with the one embodiment of the present invention.
Figure 3:
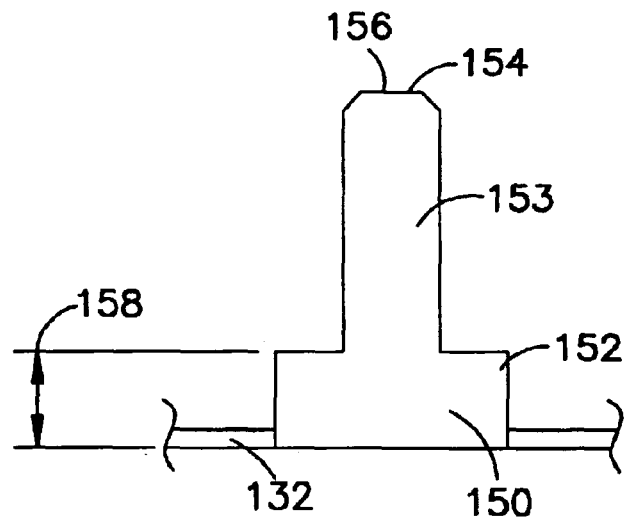
FIG. 3 is a portion of a side view illustrating a bracket constructed in accordance with one embodiment of the present invention.
Figure 4:
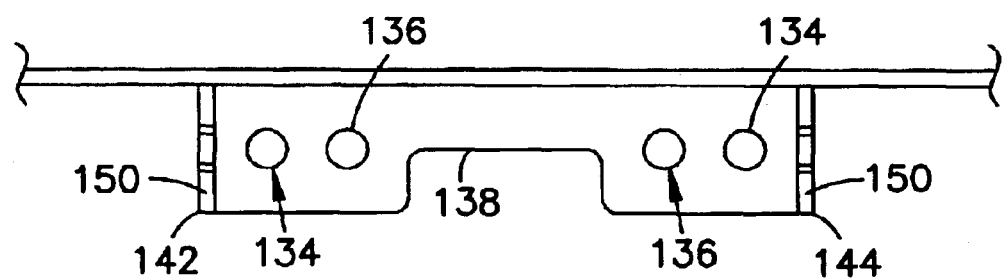
FIG. 4 is a portion of a top view illustrating a bracket constructed in accordance with one embodiment of the present invention.

FIGS. 2–4 illustrate various views of another embodiment of a bracket 130. As shown in FIG. 2, the bracket 130 includes a support flange 132, an outer flange 170, and at least one assembly tab 150. The outer flange 170 is adapted to couple with the computer chassis 100 (FIG. 1). The outer flange 170 extends from a first end 174 to a second end 176. The first end 174 comprises a tab 178 which removably couples with corresponding structure of the chassis 100. The second end 176 comprises a flange 177 which is folded over and is transverse to the outer flange 170. The flange 177 is adapted to receive a fastener (not shown), such as a threaded fastener, therethrough to couple the flange 177 with the chassis 100, although other methods of attachment of the bracket 130 can also be incorporated. The outer flange 170 also includes a cutout 172 to allow media access with the computer system. The outer flange 170, in one embodiment, is disposed transverse to the support flange 132.

The support flange 132, as shown in more detail in FIGS. 2 and 4, is adapted for coupling and supporting a printed circuit board therewith. The support flange 132 extends from a first end 142 to a second end 144. Disposed at each end, in one embodiment, is at least one assembly tab 150. It should be noted that one or more assembly tabs 150 can be used with the bracket 130. The support flange 132 is further defined by a first set of apertures 134. The first set of apertures 134 form, in one embodiment, coupling features for the assembly tab 150, as further discussed below. In addition, the first set of apertures 134 are aligned with corresponding features of a printed circuit board (FIG. 5) which allows access for rework of the attached bracket 130.

Figure 5:
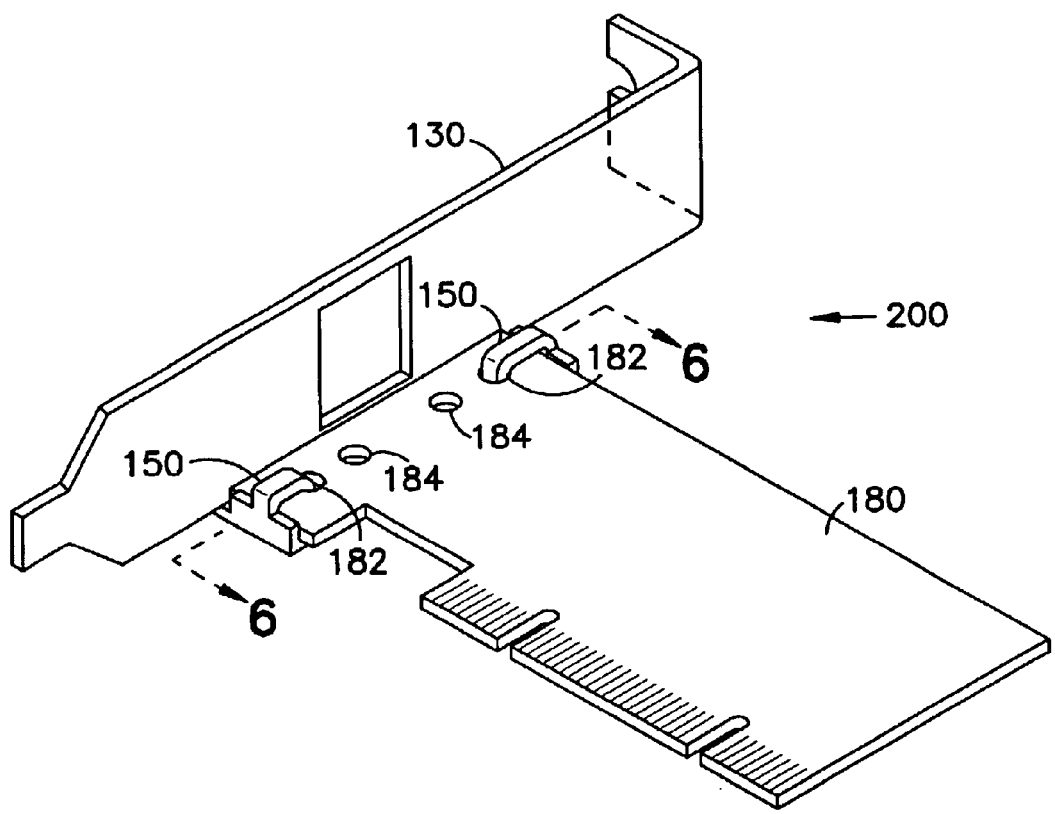
FIG. 5 is a perspective view illustrating a bracket assembly constructed in accordance with one embodiment of the present invention.

In another embodiment, the support flange 132 includes a second set of apertures 136. The second set of apertures 136 correspond with similar features in the circuit board which provide a way to align the bracket 130 with the circuit board, as further discussed below. In another embodiment, the second set of apertures 136 also allow for grounding of the bracket 130 to the circuit board. The support flange 132, in another embodiment as shown in FIG. 4, further includes a cutout 138. The cutout 138 allows for clearance for connector alignment pins (not shown), which protrude through the circuit board (FIG. 5).

As mentioned above, the support flange 132 has at least one assembly tab 150 coupled therewith. The assembly tab 150 is adapted to retain a printed circuit board (FIG. 5) to the bracket 130, while also providing easy assembly of the printed circuit board to the bracket 130. The assembly tab 150, shown in more detail in FIG. 3, includes a shoulder portion 152 which is coupled with the support flange 132. It should be noted that one or more assembly tabs 150 can be provided with the bracket 130.

In one embodiment, the shoulder portion 152 is foldably coupled with the support flange 132 along a fold line (not shown). Alternatively, the shoulder portion 152 can be coupled with the support flange 132 in other manners, for instance, the shoulder 152 can be welded with the support flange 132. The assembly tab 150 extends from the shoulder portion 152 to a flexible portion 153 which flexes around a printed circuit board (FIG. 5). In one embodiment, the shoulder portion 152 has a height 158 of about 0.060 inches. The shoulder portion 152 assists in preventing damage to the printed circuit board 180 during assembly since the side edges of the printed circuit board are covered by the shoulder portion 152. The flexible portion 153 extends from the shoulder portion 152 to a distal tip 154 which engages with coupling features on the printed circuit board 180.

The distal tip 154 of the assembly tab 150 is adapted to couple with corresponding features on the printed circuit board 180. In one embodiment, the distal tip 154 includes a rounded portion 156 which is sized to frictionally engage corresponding features in the printed circuit board 180. Alternatively, the distal tip 154, and/or the corresponding features of the printed circuit board, can include other configurations such as snap fit features, interference fit, interlocking features, or solderable features.

FIG. 5 illustrates another embodiment, wherein a bracket assembly is provided. The bracket assembly 200 includes the bracket 130 as described for FIGS. 2–4. In addition, the bracket assembly 200 includes a printed circuit board 180 which is adapted to be coupled with the bracket 130. The printed circuit board 180, in one embodiment, includes coupling features such as a first set of printed circuit board apertures 182 and a second set of printed circuit board apertures 184. The first set of circuit board apertures 182 are adapted to align with the first set of apertures 134 of the support flange 132. Furthermore, the first set of printed circuit board apertures 182 are sized and positioned to receive the distal tip 154 of the assembly tab 150 therein. In another embodiment, the first set of printed circuit board apertures 182 are aligned with the first set of apertures 134 of the support flange 132, which allows for access for rework of the bracket 130.

The printed circuit board 180 also includes a second set of printed circuit board apertures 184. The second set of printed circuit board apertures 184 are aligned with the second set of apertures 136 of the support flange 132. The alignment of the circuit board apertures 184 with the support flange apertures 136 allows for the bracket 130 to be aligned with the circuit board 180 when the assembly tab 150 is formed to the printed circuit board 180. A fixture including tooling pins can be used to align the apertures of the bracket 130 and the printed circuit board 180 which facilitate proper and accurate assembly of the printed circuit board 180 to the bracket 130. The tooling pins protrude through the bracket 130 and the printed circuit board 180 during assembly thereof.

To assemble the bracket assembly 200, the printed circuit board 180 is placed on the support flange 132 such that the circuit board 180 is adjacent to the outer flange 170. The first set of circuit board apertures 182 are aligned with the first set of apertures 134 of the support flange 132. Optionally, the second set of circuit board apertures 184 are aligned with the second set of apertures 136 of the support flange 132, for example, using a fixture with tooling pins. Once the printed circuit board 180 is properly aligned with the bracket 130, the assembly tab 150 is coupled with the printed circuit board 180.

Figure 6:
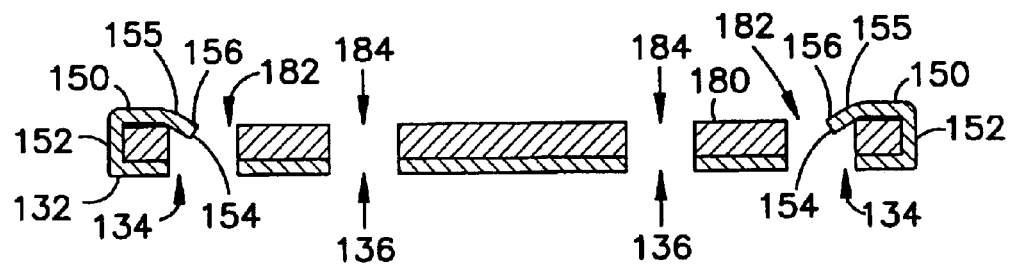
FIG. 6 is a cut-away view of the bracket assembly taken along 6—6 of FIG. 5.

To couple the printed circuit board 180 with the bracket assembly 200, in one embodiment, the flexible portion 155 is formed around the printed circuit board 180 such that the distal tip 154 is disposed in one of the first set of circuit board apertures 182, as shown in FIG. 6. In another embodiment, the distal tip 154 is formed such that it is disposed within one of the first set of circuit board apertures 182 and one of the first set of apertures 134 of the support flange 132. The single or multiple assembly tabs 150 can be formed simultaneously, for instance, by automated assembly, or can be formed one at a time. Alternatively, in another embodiment, the distal tip 154 is electrically coupled with the first set of circuit board apertures 182, for instance, to provide grounding for the circuit board 180. The printed circuit board 180, however, can also be electrically coupled with the bracket 130 in other manners. After the printed circuit board 180 is assembled with the bracket 130, the bracket assembly 200 is removed from the fixture.

The bracket 130 is formed by stamping the bracket 130 from, but not limited to, an electrically conductive material, such as steel, tin, copper, or aluminum. Those skilled in the art will recognize that other materials which provide a flexible portion 155 for the assembly tab 150 can also be used. In addition, the bracket 130 can also be formed in other manners, such as automated assembly or using a fixture.

The bracket assembly embodiments described above provide several advantages in that the circuit board is easily assembled with the bracket. The tab assembly frictionally engages the circuit board, and also allows for the printed circuit board to be electrically coupled and grounded with the bracket. Consistent geometry between the circuit board and the bracket can also be facilitated by the bracket assembly. Assembly time and parts can be reduced, to thereby reduce the cost in producing the bracket assembly. Furthermore, the bracket assembly assists in preventing damage to the printed circuit board during assembly of the bracket assembly.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:

placing a circuit board on a support flange of a bracket assembly, the bracket assembly including at least one assembly tab;

folding the at least one assembly tab over the circuit board toward the support flange, where the at least one assembly tab is folded from a first unfolded position to a second folded position;

disposing at least a portion of the at least one assembly tab into a portion of the circuit board in the second folded position, wherein at least a portion of the at least one assembly tab is substantially parallel to the support flange; and folding two or more assembly tabs over the circuit board.

2. The method as recited in claim 1, wherein the two or more assembly tabs are folded over the circuit board simultaneously.

3. The method as recited in claim 1, further comprising coupling the at least one assembly tab with the support flange.

4. The method as recited in claim 3, further comprising disposing the at least one assembly tab in a portion of the support flange.

5. The method as recited in claim 1, further comprising aligning features of the circuit board with alignment features on the support flange.

6. A method for forming a bracket assembly, the method comprising:

placing a circuit board directly adjacent to a bracket, the bracket including a support flange;

deforming at least a portion of the bracket over the circuit board;

coupling the at least one portion of the bracket within coupling features of the support flange; and folding two or more assembly tabs over the circuit board.

7. The method as recited in claim 6, wherein the two or more assembly tabs are folded over the circuit board simultaneously.

8. The method as recited in claim 6, wherein coupling the at least one portion of the bracket includes coupling the at least one portion of the bracket within one or more apertures formed in the support flange.

9. The method as recited in claim 6, wherein coupling the at least one portion of the bracket includes coupling a slender flexible finger with the support flange.

10. The method as recited in claim 6, wherein deforming at least the portion of the bracket includes deforming the portion over a side edge of the circuit board.

11. The method as recited in claim 6, further comprising aligning features of the circuit board with alignment features on the support flange.

12. The method as recited in claim 6, further comprising electrically grounding the circuit board to the bracket.

* * * * *